United States Patent
Hua et al.

(10) Patent No.: US 9,824,962 B1
(45) Date of Patent: Nov. 21, 2017

(54) LOCAL DENSE PATCH FOR BOARD ASSEMBLY UTILIZING LASER STRUCTURING METALLIZATION PROCESS

(71) Applicant: Intel Corporation, Santa Clara, CA (US)

(72) Inventors: Fay Hua, Fremont, CA (US); Adel A. Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/279,708

(22) Filed: Sep. 29, 2016

(51) Int. Cl.
*H01L 23/498* (2006.01)
*H01L 21/48* (2006.01)
*H01L 23/00* (2006.01)

(52) U.S. Cl.
CPC .......... *H01L 23/498* (2013.01); *H01L 21/486* (2013.01); *H01L 21/4846* (2013.01); *H01L 23/49811* (2013.01); *H01L 23/49894* (2013.01); *H01L 24/24* (2013.01); *H01L 2224/245* (2013.01); *H01L 2224/24151* (2013.01)

(58) Field of Classification Search
CPC . H01L 21/4846; H01L 21/486; H01L 23/489; H01L 23/49811; H01L 23/49894; H05K 1/0296
See application file for complete search history.

(56) References Cited

U.S. PATENT DOCUMENTS

2015/0041203 A1* 2/2015 Lebens ................ H05K 1/0296
174/261

* cited by examiner

*Primary Examiner* — Daniel Shook
(74) *Attorney, Agent, or Firm* — Alpine Technology Law Group LLC

(57) ABSTRACT

Methods of forming microelectronic package structures are described. Those methods/structures may include forming a high density region on a board comprising a first plurality of conductive structures disposed on a dielectric material on the board, wherein the first plurality of conductive structures comprises a first pitch between individual ones of the first plurality of conductive structures. A low density region on the board comprises a second plurality of conductive structures disposed on the dielectric material, wherein the second plurality of conductive structures comprises a second pitch between individual ones of the second plurality of conductive structures, wherein the second pitch is more than about twice the magnitude of the first pitch.

24 Claims, 11 Drawing Sheets

LOCAL DENSE PATCH FOR BOARD ASSEMBLY UTILIZING LASER STRUCTURING METALLIZATION PROCESS

BACKGROUND OF THE INVENTION

Package substrates for microelectronic devices may comprise a relatively high density of conductive features (such as, for example, a very fine solder bump pitch) as compared with lower density substrates, such as a printed circuit board (PCB), for example. Consequently, costs may be higher for package substrate fabrication than for those boards/substrates which possess less dense conductive feature dimensions.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
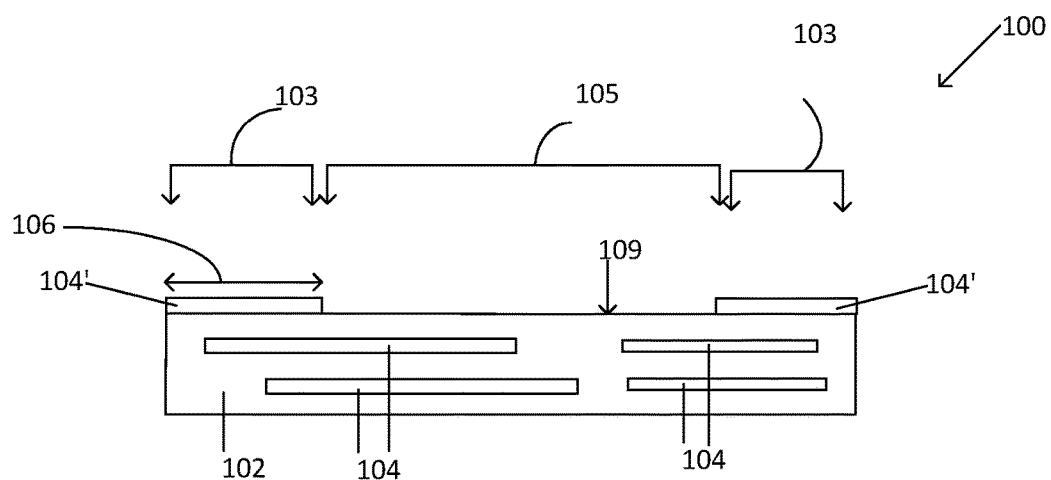
FIGS. 1a-1g represent cross-sectional views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between an electrical component, such a an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die may include a front-side and an opposing back-side. In some embodiments, the front-side may be referred to as the "active surface" of the die. A number of interconnects may extend from the die's front-side to the underlying substrate, and these interconnects may electrically couple the die and substrate. In some cases a die may be directly coupled to a board, such as a motherboard. Interconnects/traces may comprise any type of structure and materials capable of providing electrical communication between a die and substrate/board. In some one embodiment, a die may be disposed on a substrate in a flip-chip arrangement. In an embodiment interconnects comprises an electrically conductive terminal on a die (e.g., a pad, bump, stud bump, column, pillar, or other suitable structure or combination of structures) and a corresponding electrically conductive terminal on the substrate (e.g., a pad, bump, stud bump, column, pillar, or other suitable structure or combination of structures).

Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between a die and substrate). In some embodiments herein, a die may be coupled with substrate by a number of interconnects in a flip-chip arrangement. However, in other embodiments, alternative structures and/or methods may be utilized to couple a die with a substrate.

Embodiments of methods of forming packaging structures, such as methods of forming microelectronic substrate structures, are described. Those methods/structures may include forming a local dense patch of conductive features comprising fine line widths and spacing, as well as fine pitch, on a microelectronic board using a self-assembled monolayer (SAM) assisted, laser direct structuring metallization process. The embodiments herein enable the realization of fine pitched microelectronic feature fabrication on a board while reducing fabrication costs.

FIGS. 1a-1g illustrate side cross-sectional views of embodiments of fabricating local dense patch/conductive regions within a package structure, such as within/on portions of a printed circuit board (PCB), a high density interconnects board (HDI), or a package substrate, for example. In FIG. 1a (cross-sectional view), a portion of package structure 100 is shown, which may comprise a portion of a board 100, such as a fiberglass reinforced epoxy laminated board that is flame retardant (FR4) board, for example. In another embodiment, the package structure 100 may comprise a portion of a PCB board, or a HDI board/PCB, or a package substrate. The structure 100 may comprise conductive traces/interconnect structures 104 that may be disposed in a dielectric material 102. In an embodiment, the dielectric material 102 may comprise any type of substrate build-up material, and/or may comprise a polymer, epoxy or resin material, in some cases. In an embodiment the package structure 100 may comprise top level conductive structures 104' that may be disposed on a top surface 109 of the package structure 100. The top level conductive structures 104, 104' may comprise conductive traces, or any other type of conductive structures suitable for electrically and physically coupling components on a board/substrate, such as solder balls, conductive pads or conductive vias, for example.

In an embodiment, the package structure 100 may comprise a first region 105, and a second region 103. In an embodiment, the first region 105 may comprise a high density region 105 and the second region 103 may comprise a low density region 103. In an embodiment the second/low density region 103 may comprise traces/conductive structures such as conductive structures 104, 104' that may comprise a width 106 of greater than about 50 microns, for example. In some cases, the width 106 of conductive structures in the second region 103 may comprise greater than at least about four times a width of conductive features/structures disposed in the first region/high density region 105 of the package structure 100. In other embodiments, the width 106 of the conductive structures 104, 104' in the second region 103 may comprise at least about twice a width of conductive features/structures disposed in the first region/high density region 105.

In an embodiment, the width 106 may comprise a line width of a conductive trace/interconnect structure in the second region 103. In an embodiment, conductive structures, such as conductive structures 104, 104', may comprise a spacing between individual conductive structures that may comprise greater than at least about four times a spacing between individual conductive structures in the first region 105. In other embodiments, a spacing between individual conductive structures may comprise greater than at least about two times a spacing between individual conductive structures in the first region 105. In an embodiment, a spacing between individual conductive structures may comprise greater than about 50 microns. In an embodiment, a pitch, such as a bump pitch between conductive structures (such as between solder balls/bumps, for example) may comprise greater than about 250 microns in the second/low density region 103. In an embodiment, a pitch between conductive structures (such as between solder balls/bumps, for example) may comprise between about 200 microns and about 600 microns in the second/low density region 103. In an embodiment, the first region 105 may comprise a region wherein a laser direct structuring metallization process may be performed, as described subsequently herein, whereas the laser direct structuring metallization process is not utilized in the second region 103.

Figure 1B:
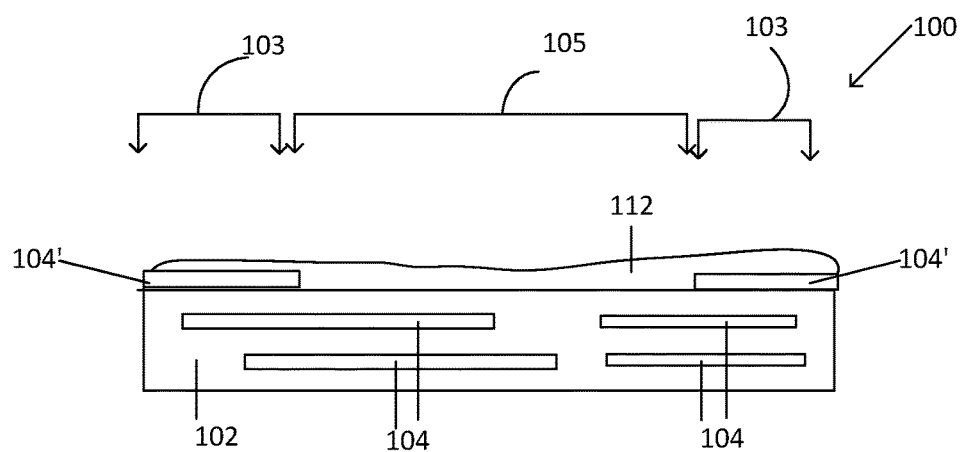

In an embodiment, a protective coating 112 may be placed on the top surface 109 of the package structure 100 (FIG. 1b). The protective coating 112 may be disposed on all or part of the conductive interconnect structures 104'. The coating 112 may comprise a solder resist material, in an embodiment. In an embodiment, the coating 112 may comprise a film or spray coating, such as a wax or polymer based material, for example. In an embodiment, the coating may provide a mask to cover areas on the package structure 100 that may not undergo the laser metallization process, such as in the second region 103.

Figure 1C:
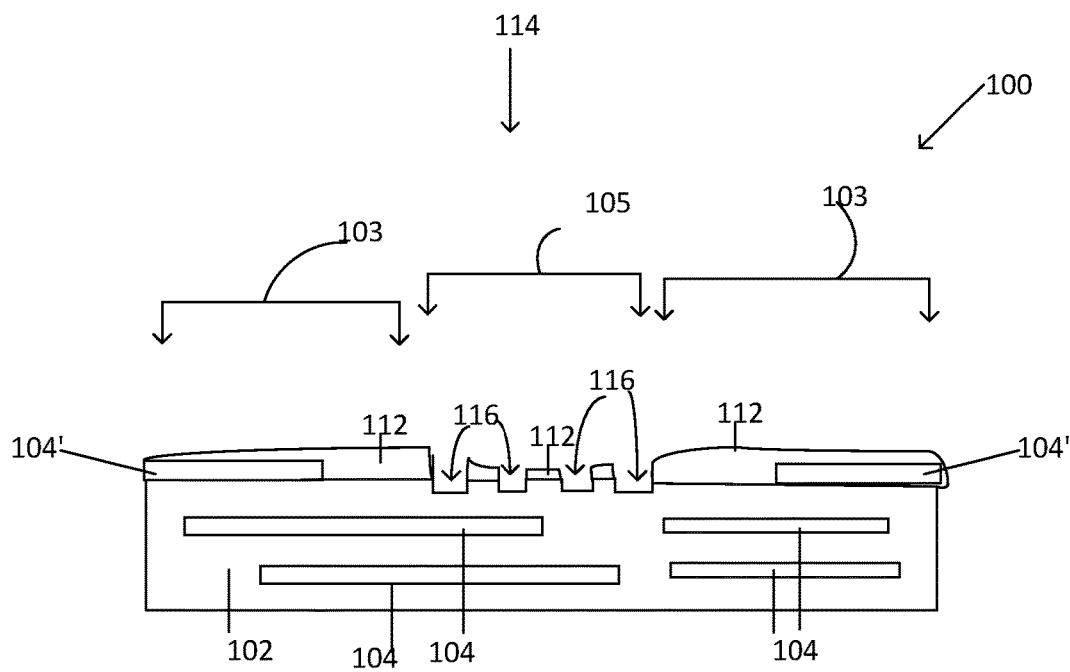
Figure 1D:
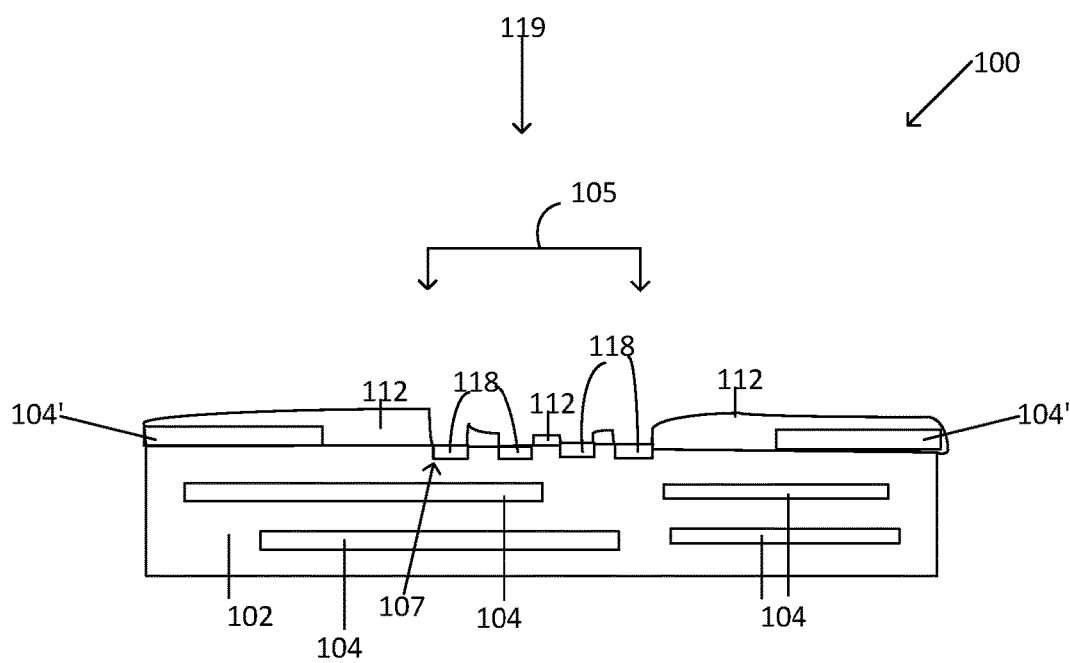

A laser direct structuring metallization process 114 may be used to form local high density conductive structures in a portion of the first region 105 of the package structure 100 (FIG. 1c). In an embodiment, the laser direct structuring metallization process 114 may create conductive features comprising high density, fine pitch, small line width and line spacing, for example, in portions of the first region 105. In an embodiment, the laser process 114 may create vias/openings 116 in the dielectric material 102 in the first region 105 of the package structure 100, but no such openings 114 are created in the second region 103. In an embodiment, the laser process 114 may remove dielectric material by laser ablation, from the first region 105 to form the vias/activated areas 116. A laser may be used during the process to break bonds in the dielectric material 102, and may activate/pattern desired areas within the first region 105 with the laser energy. The features created by the laser may include traces, pads and bump structures which possess very fine bump pitches (between about 70 to about 110 microns, for example), very fine line widths (between about 8 to about 15 microns, for example) and very fine spaces between lines (between about 8 to about 15 microns, for example), for example. In an embodiment, conductive feature in the first/high density region 105 may comprise in some embodiments about 80 micron to about 150 micron bump pitches, and between about 9 micron to about 12 micron line space and line width dimensions.

In an embodiment, the laser direct structuring metallization process 114 may be used to activate the areas in the first region 105 where local high density conductive structures/interconnects are needed, according to the particular design. Referring to FIGS. 2a-2f (which depict the laser metallization process 114 in greater detail), in one embodiment, the dielectric layer 202 located in the second region 205 of the package structure 200 (similar to the second region 105 of the package structure 100 of FIG. 1c) may be activated by exposure to electromagnetic radiation, such as by an ultraviolet (UV) laser radiation (FIG. 2a) during the laser metallization process 214. One type of laser that may be used is a 355-nanometer wavelength UV laser, however any suitable wavelength may be employed to activate the dielectric material 202. The areas activated by the laser correspond to the dimensions/patterns of the conductive structures that are created in the first region 205.

Figure 2A:
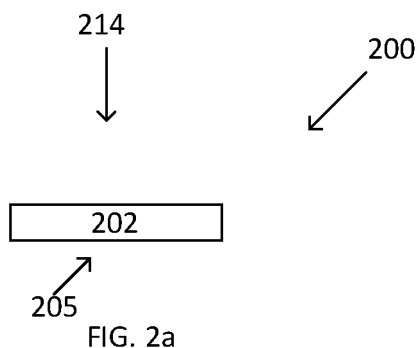
FIGS. 2a-2e represent cross-sectional and top views of structures according to embodiments.
Figure 2B:
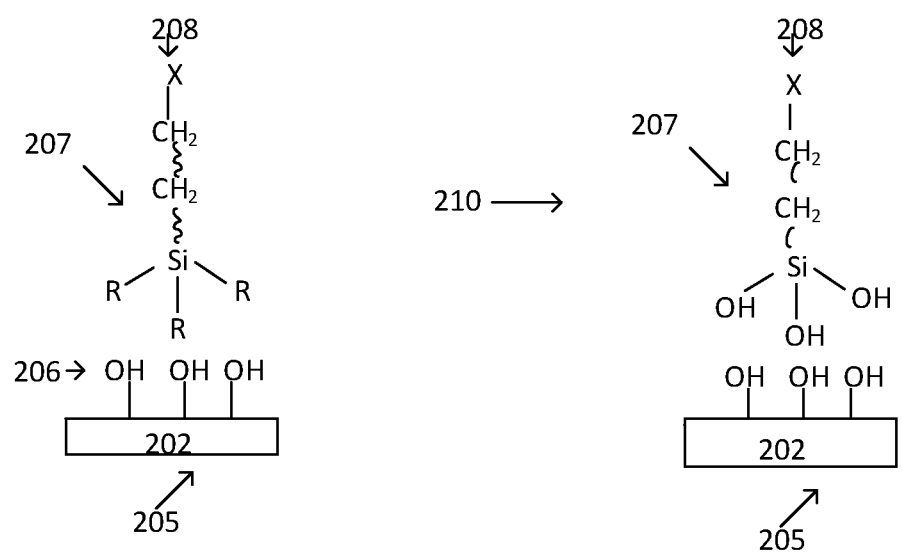
Figure 2C:
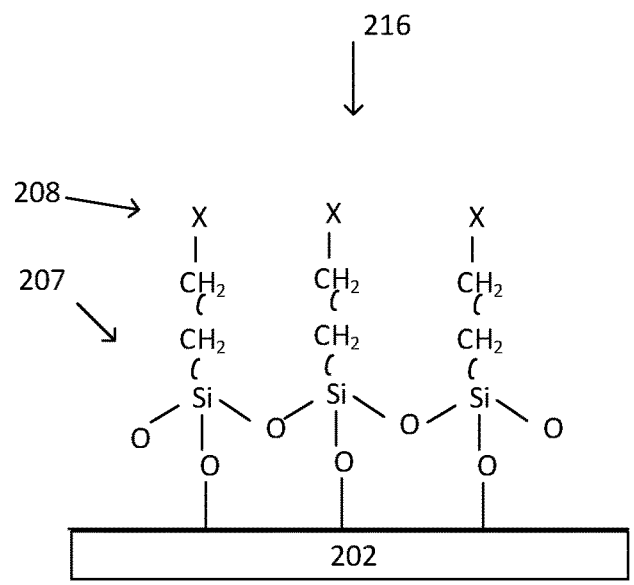

Following the activation of the desired regions of the dielectric material 202, the activated areas of the first region 205 are modified by supplying hydroxyl (—OH) groups 206 to the activated areas (FIG. 2b). For example, the activated areas may be exposed to water such as by placing the package structure 200 in a water bath to allow hydroxyl groups to react or otherwise bond with the activated areas in the dielectric material 202. In an embodiment, a hydrolysis process 210 may be used to form a hydroxyl-rich area on the dielectric layer 202. Self-assembled monolayers 207 may be formed/deposited on the modified active area of the dielectric material 202. In one embodiment, a self-assembled monolayer 207 may be formed from/comprise an organosilicon compound such as a siloxane (e.g., $R_3Si$—O—$SiR_3$) or silanol (e.g., $R_3SiOH$).

An example of a siloxane self-assembled monolayer 207 grafting onto a modified activated area of a substrate is shown in FIG. 2b. In an embodiment, the self-assembled monolayer may be formed only in the laser activated area(s), wherein areas of the dielectric adjacent the activated areas do not comprise self-assembled monolayers. In one embodiment, the organosilicon compound 207 includes a functional group 208, that is suitable for the reaction of the organosilicon compound 207 with a catalyst. Representative functional groups 208 include but are not limited to an amine moiety, a sulfhydryl moiety and a pyridil moiety, for reacting with a palladium (Pd) catalyst. In an embodiment, an organosilicon compound 207 may be dissolved in a solvent such as toluene, dimethylformanide (DMF) or hexane and introduced to the package structure 200, such as in a solvent bath. In an embodiment, the organosilicon 207 (e.g., siloxane) undergoes hydrolysis 210 followed by a condensation process 216 (FIG. 2c) with hydroxyl moieties on the dielectric material 202 to form/react the monolayer 207 on the activated dielectric layer 202 of the first region 205. In an embodiment, the monolayer 207 is chemically bonded to the dielectric layer 202.

Figure 2D:
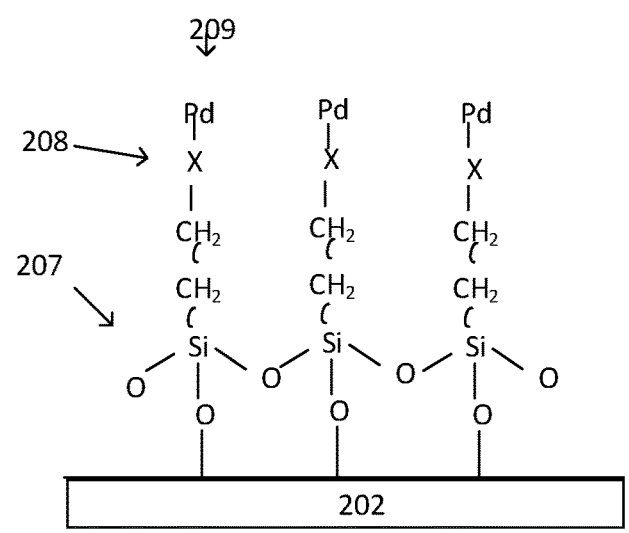

In an embodiment, the functional groups 208 of the self-assembled monolayer 207 may react with a catalyst 209 (FIG. 2d). FIG. 2d depicts a palladium catalyst, but any suitable catalyst 209 may be employed. Because the self-assembled monolayer 207 is disposed on the laser activated area of the dielectric material 202, the catalyst reaction (e.g., absorption) will be carried out only on the activated area of the dielectric layer 202, and not on the non-activated/non-patterned dielectric material 202.

Figure 2E:
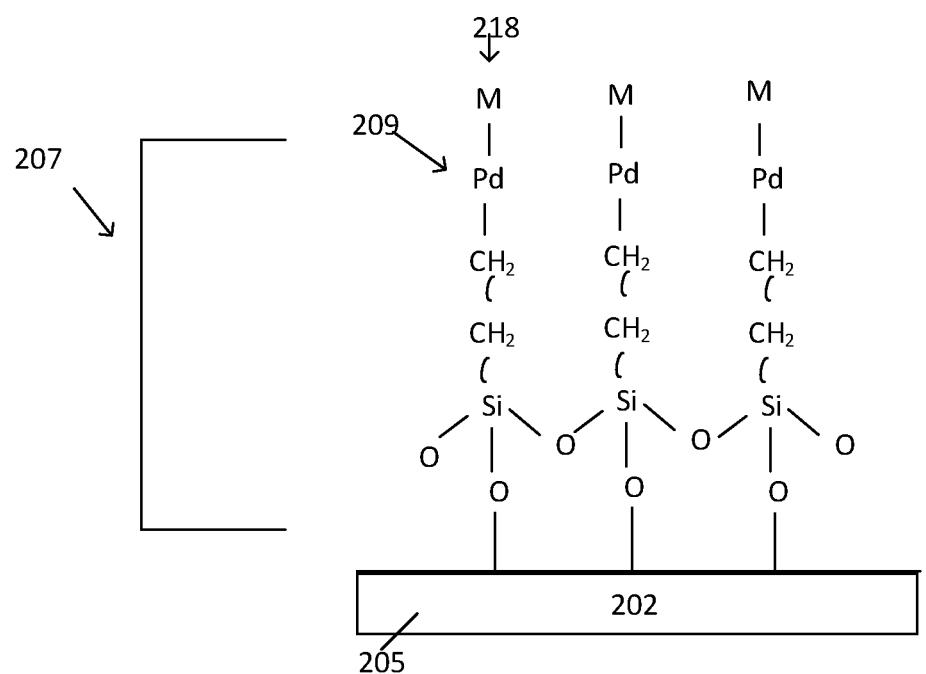

In an embodiment, a conductive material 218 may react with the catalyst 209 on/bonded to the self-assembled monolayer 207 (FIG. 2e). In one embodiment, the package structure 200 may be placed in a bath with an ionic form of the conductive material (e.g., nickel ion, copper ion, silver or gold ions etc.) and a reducing agent such as an amine, a borane or a hypophosphite. In the bath, an electroless oxidation-reduction (redox) reaction occurs between the agent in the bath and an electrolyte. The reducing agent is oxidized and the catalyst 209 on the self-assembled monolayer 207 is reduced. The reduced catalyst acts as a catalyst for a reduction of the conductive/metal ions in the bath (e.g., nickel, copper) to metallic to form first nuclei, and then the conductive material 218, thus allowing metallization/formation of conductive structures on the activated area of a predetermined shape and size. In this manner, the conductive structures are selectively formed on the activated portions of the dielectric 202 only. In an embodiment, the self-assembled monolayer 207 is directly disposed between the activated portions of the dielectric 202, and the conductive material/structures 218.

Referring back to FIG. 1d, conductive material 118 may be formed in the vias 116 created by the laser metallization process 114 in the first region 105, by utilizing a plating process 119, for example (similar to the plating process described in FIG. 2e, for example). In an embodiment, self-assembled monolayers 107 (such as the self-assembled monolayers 207 depicted in FIG. 2e) may be disposed on a top surface of the dielectric material 202 of the vias 116 (i.e. in the bottom of the vias 116), prior to the formation of the conductive material 118. The self-assembled monolayers, which may comprise organosilicon compound(s) may be a distinct material/layer from the dielectric itself. In other words, the organosilicon monolayers are not included in the dielectric material, but are formed during the laser process 114, subsequent to the dielectric material 102 formation. In an embodiment, the conductive material/structures 118 may comprise pads for the placement of electronic components, including die pads, for example, and can also comprise interconnect traces, or any other suitable conductive structures, depending upon the particular design requirements.

The conductive structures/features 118 may comprise conductive traces/lines, which may comprise fine line widths and space widths, such as line widths and spaces between lines, of about 12 microns and below. In an embodiment, the conductive structures 118 may comprise high density conductive structures 118. In an embodiment, the conductive features/components may comprise a pitch (such as a pitch between adjacent solder bumps, for example) between adjacent conductive structures of between about 70 microns to about 110 microns. In an embodiment, the conductive structures 118 only form in the vias/activated areas that comprise the catalyst, such as palladium. The un-activated dielectric material 102 adjacent the laser activated vias does not comprise the catalyst, nor does it comprise the organosilicon compound. In an embodiment, the self-assembled monolayer, which may comprise an organosilicon compound, may be detected using spectrographic analysis, such as an x-ray photoelectron spectroscopy (XPS) technique. The spectra of the organosilicon compound may show significantly higher spectrographic silicon dioxide and nitrogen signals than metallization structures that do not use the organometallic compound between the conductive material 118 and the dielectric material 102.

Figure 1E:
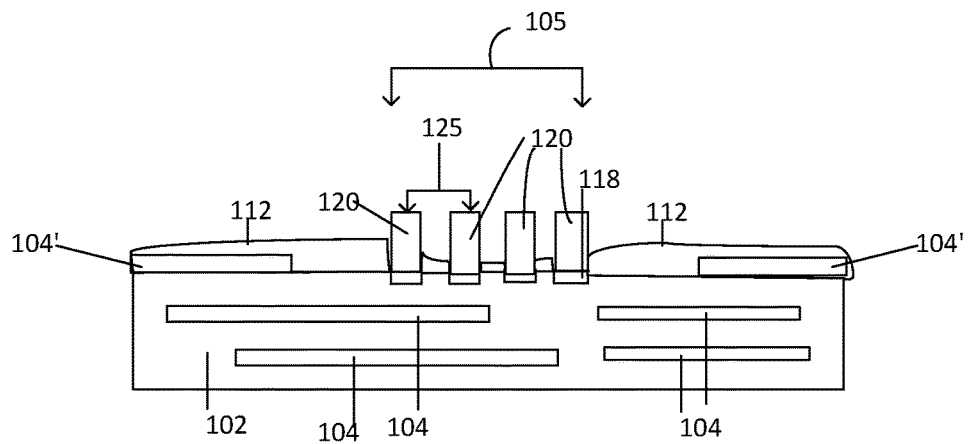

In an embodiment, the conductive structures 118 may be further plated up, and/or a surface finish 120 may be applied to the pad (FIG. 1e). In an embodiment, to avoid oxidation of the exposed conductive structures 118, which may comprise copper, for example, and to improve solder performance and reliability, a surface finish 120 may be applied to the conductive structures 118. Different types of surface finishes can be used such as electroless nickel palladium gold or electroless nickel immersion gold, for example. In an embodiment, the conductive structure 118 may comprise primarily copper. In an embodiment, conductive structures 118 comprising bumps, for example, may comprise a pitch 125 between adjacent conductive structures 118 of between about 70 to about 110 microns.

Figure 1F:
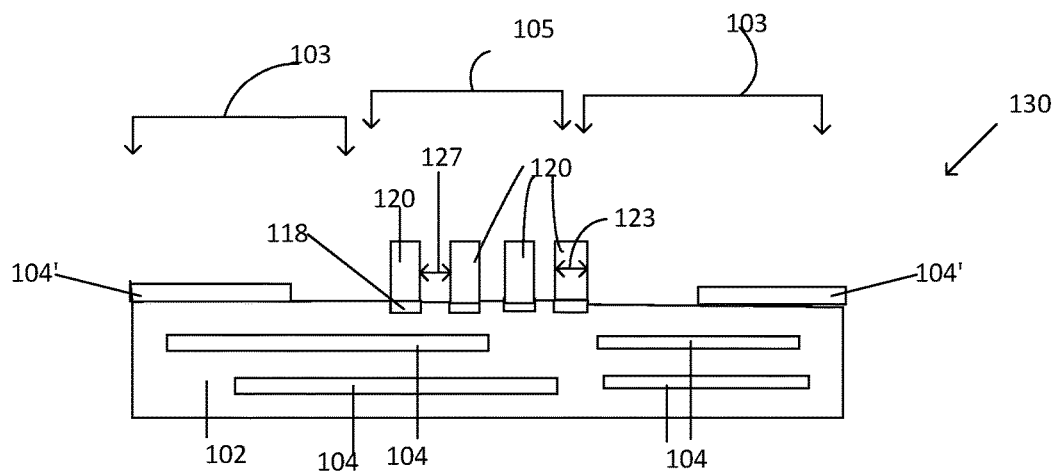
Figure 1G:
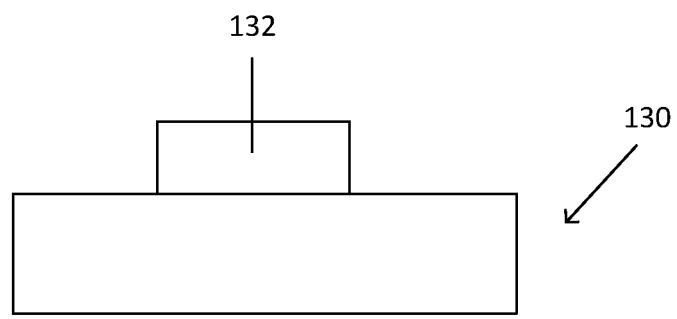

The coating 112 may then be removed to produce a package structure 130, comprising a local dense/high density region/patch in the first region 105 and a low density region in the second region 103 (FIG. 1f). In an embodiment, conductive structures 118 may comprise conductive lines/traces comprising line widths 123 and line spacing 127 between about 8 microns and about 15 microns. A die 132 may be attached to the package structure 130 comprising the local dense patch/region (FIG. 1g). In an embodiment, the local dense patch(s) can be located in any convenient portion(s) of the package structure 130, and the die 132 may or may not be placed on/over the dense patch region.

Figure 1H:
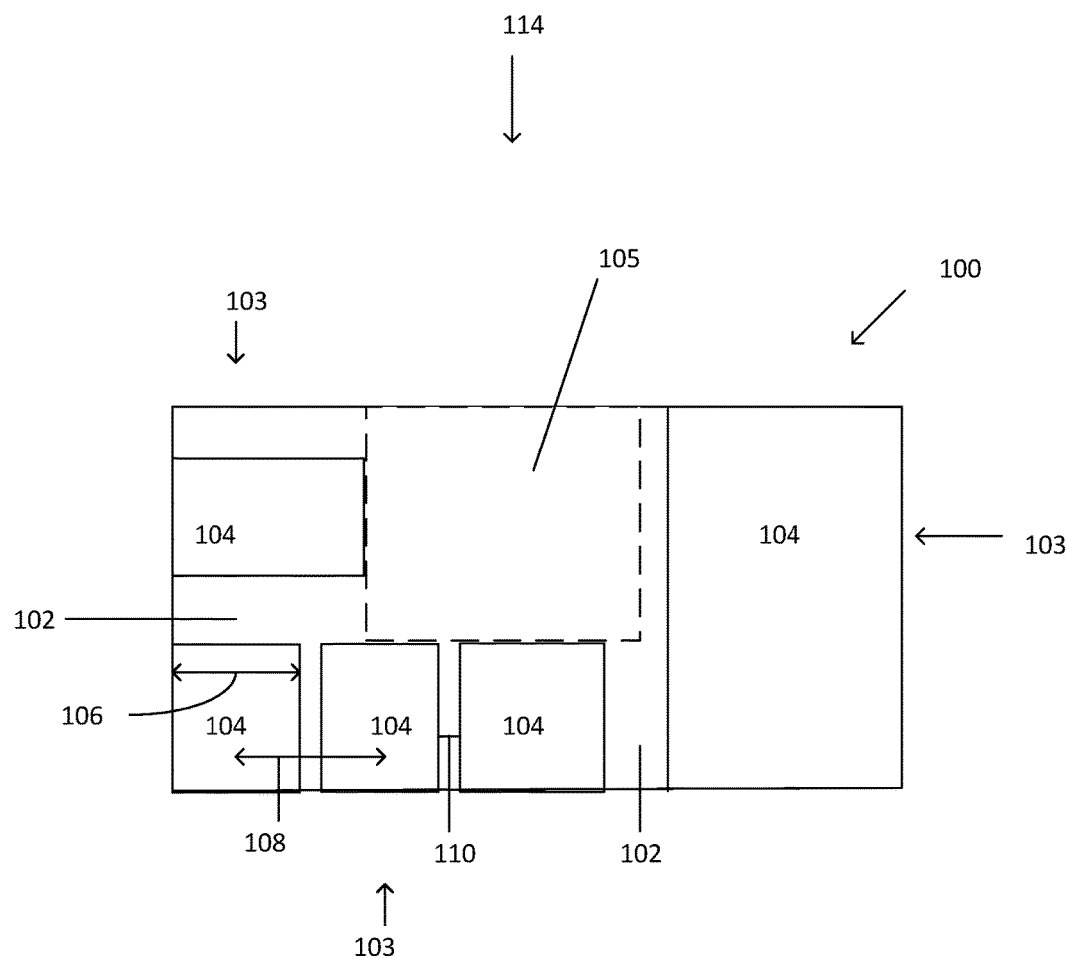
FIGS. 1h-1i represent top views of structures according to embodiments.
Figure 1I:
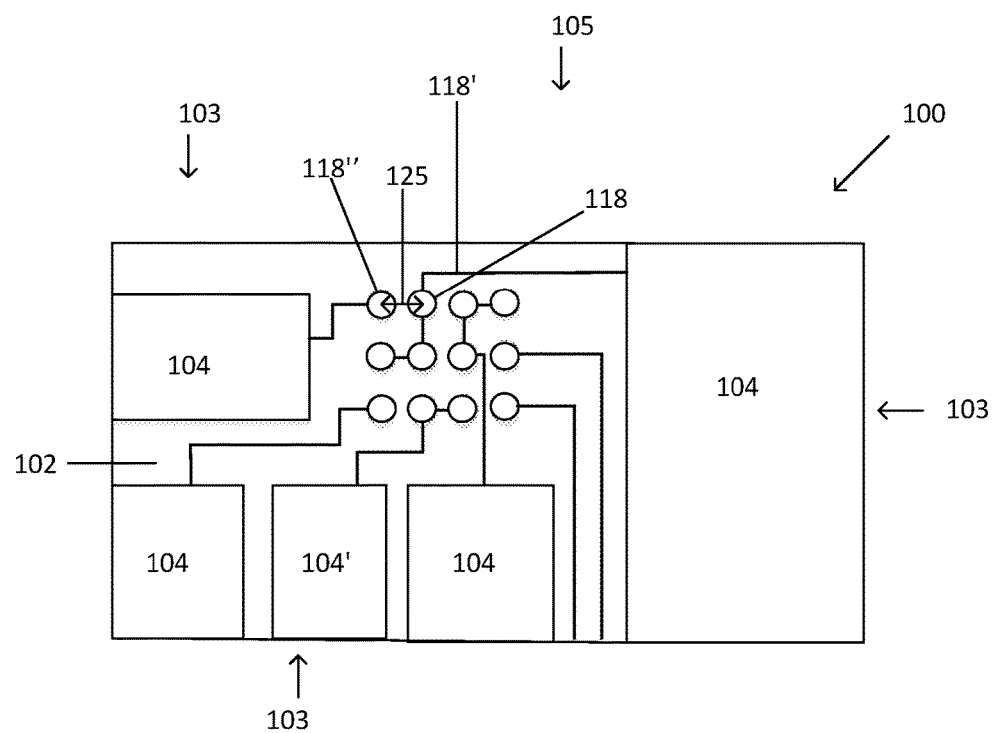

FIGS. 1h-1i depict top views of the package structure 100 comprising a local dense patch that is fabricated using direct laser structuring. The low density region 103 comprises low density conductive structures 104 disposed on/within the dielectric material 102 (FIG. 1h). The conductive structures 104 may comprise a pitch 108 between adjacent conductive structures 104 of greater than about 250 microns, in an embodiment, and may comprise a line width 106 and line space 110 of greater than about 50 microns, in an embodiment. In an embodiment, the low density region 103 may comprise a plurality of conductive structures, wherein the pitches and line/space dimensions are larger than the pitches and line/space dimensions in the first region 105.

A portion of the high density region 105 may be activated by a laser, to define various conductive structures using the laser metallization process 114, wherein a plurality of high density conductive structures 118 may be formed (FIG. 1i). In an embodiment, individual adjacent high density conductive structures 118 may comprise a pitch 125 which may be between about 70 microns to about 110 microns. Conductive traces 118' may comprise a line width and line space of below about 12 microns. In an embodiment, the plurality of high density conductive structures 118 may comprise a plurality of plated conductive metal structures 118 disposed on an organosilicon compound, such as silane and/or siloxane (as depicted in FIG. 2e, for example). In an embodiment, a first and a second high density conductive structure 118, 118" are adjacent each other on the dielectric material 102 in the high density region. An organosilicon compound disposed on the dielectric material 100 may be directly beneath the first high density conductive structure 118, and disposed directly beneath the second high density conductive structure 118". A pitch 125 between the first and second high density conductive structures 118, 118" may be less than about 100 microns The low density region 103 may comprise a plurality of low density conductive structures 104 that are not disposed on an organosilicon, for example. In an embodiment, a first and a second low density conductive structure 104, 104' may be adjacent each other on the dielectric material 102 in the low density region 193. A pitch between the first and second low density conductive structures is above about 200 microns, in an embodiment. The local dense patch of conductive structures, on the first region 105 may be located anywhere on the package substrate 100, and in some cases, may be located on a side portion of the package structure 100, such as in 3D patterning applications.

In an embodiment, the plurality of conductive structures 118 may comprise a ball grid array comprising solder materials, for example. The die/device 132 of FIG. 1g may comprise any type of device suitable for a particular application, such as but not limited to a microprocessor, a graphics processor, a signal processor, a network processor, a chipset, etc. In one embodiment, the die 132 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of die/devices. An active side (which may comprise various circuit components such as transistors, for example) of the die 132 may be electrically and physically coupled with the substrate/board 130 by solder balls/conductive structures 118.

The various embodiments of the package assemblies/structures described herein enable direct laser structuring metallization for fine pitch and line/space dimension in local regions on a board, such as for a PCB or HDI board. The cost of making package substrates can be higher than standard HDI PCB's. In many cases, there are only a few components or dies on the system that have a very small bump pitch. This can require the use of higher cost HDI PCB or package substrates to be able to break out the electrical signals from these components, which can lead to higher manufacturing cost for the substrate and additional restrictions on the material selections, for example, some high performance radio frequency (RF) substrates may only be available for PCB, and not for package substrates. Enabling the fabrication of local dense patches/regions that can support very fine lines and spaces, significantly reduces system cost. The embodiments herein can be applied on different types of substrate materials, and allows down to about 10 micron line width and space. The laser process can be done with substrate build up processes and on board build up materials as well.

Figure 3:
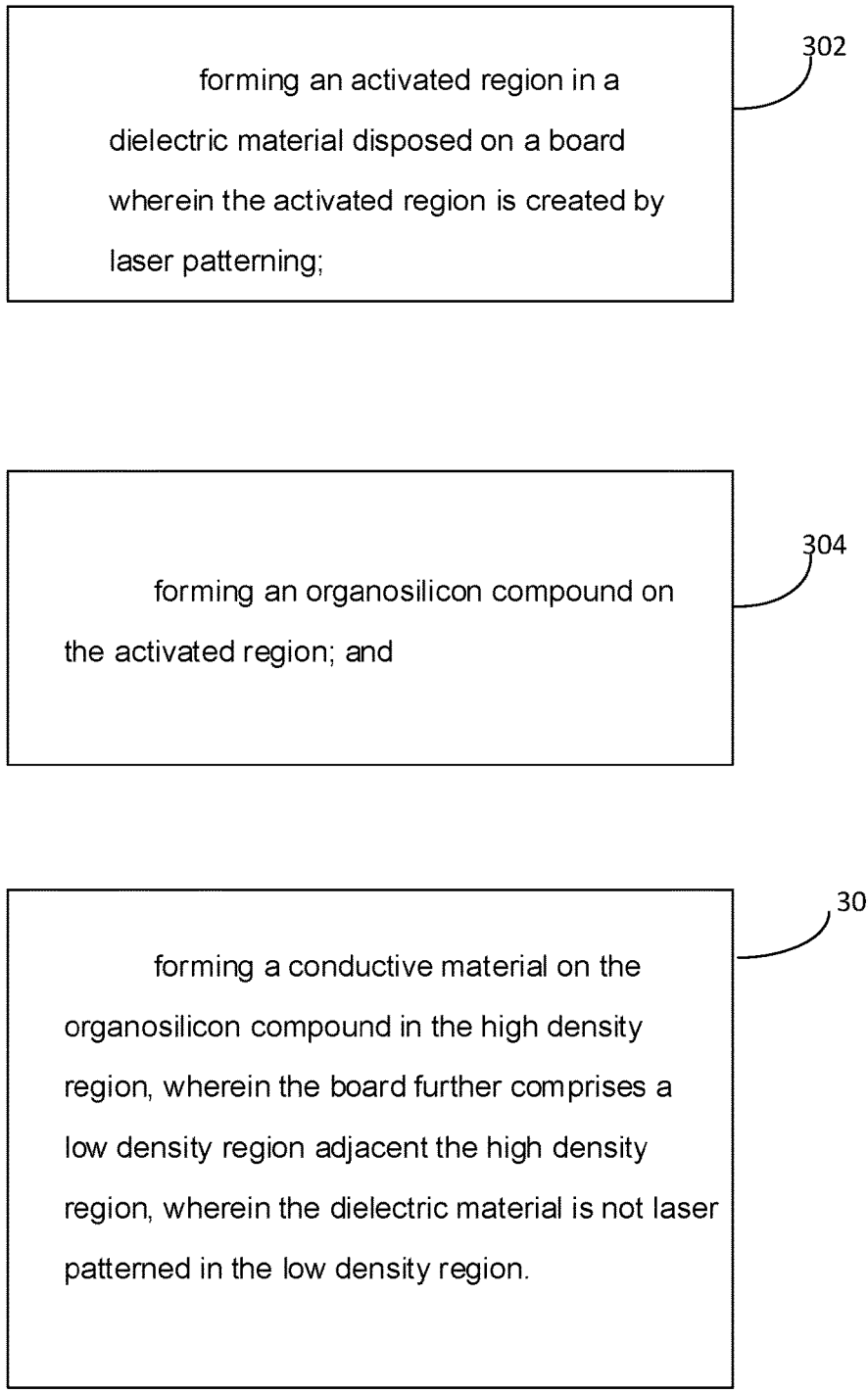
FIG. 3 represents a flow chart of a method according to embodiments.

FIG. 3 depicts a method according to embodiments herein. At step 302, an activated region is formed in a dielectric material disposed on a board, wherein the activated region is created by laser patterning. The activated region formed by the laser patterning defines conductive features, such as solder pads/balls and/or conductive lines/traces, in an embodiment. At step 304, an organosilicon compound may be formed on the activated region. The organosilicon compound may comprise a silanol and/or a siloxane compound, for example, and may only form on the activated portion of the dielectric material.

At step 306, a conductive material may be formed on the organosilicon compound in the high density region, wherein the board further comprises a low density region adjacent the high density region, wherein the dielectric material is not laser patterned in the low density region. The conductive material may comprise a plated metal, and may only plate on the organosilicon compound, and not on un-activated dielectric material. In an embodiment, the conductive material may be disposed/formed directly on the organosilicon compound, and may be reacted with a catalyst on the organosilicon compound, such as palladium, for example. The pitch and line spacing of the conductive structures formed in the high density region are much finer/denser than conductive structures located in the low density region of the board.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the package structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
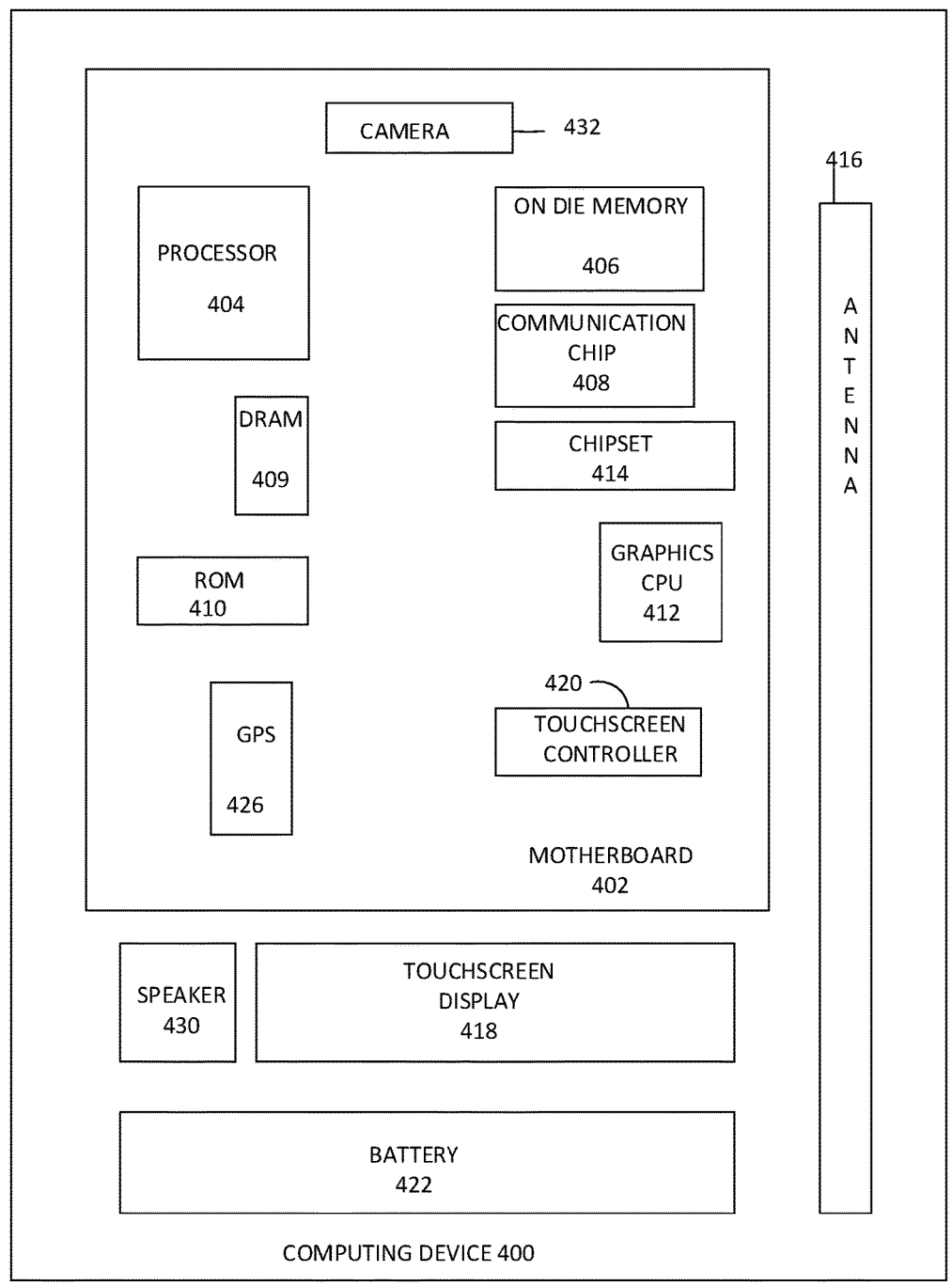
FIG. 4 represents a schematic of a computing device according to embodiments.

FIG. 4 is a schematic of a computing device 400 that may be implemented incorporating embodiments of the package structures described herein. For example, any suitable ones of the components of the computing device 400 may include, or be included in, a package structure 130 of FIG. 1f, for example, in accordance with any of the embodiments disclosed herein. In an embodiment, the computing device 400 houses a board 402, such as a motherboard 402 for example. The board 402 may include a number of components, including but not limited to a processor 404, an on-die memory 406, and at least one communication chip 408. The processor 404 may be physically and electrically coupled to the board 402. In some implementations the at least one communication chip 408 may be physically and electrically coupled to the board 402. In further implementations, the communication chip 408 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 409, non-volatile memory (e.g., ROM) 410, flash memory (not shown), a graphics processor unit (GPU) 412, a chipset 414, an antenna 416, a display 418 such as a touchscreen display, a touchscreen controller 420, a battery 422, an audio codec (not shown), a video codec (not shown), a global positioning system (GPS) device 426, a speaker 430, a camera 432, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a first region of a substrate comprising a first high density conductive structure and a second high density conductive structure, wherein the first and second high density conductive structures are adjacent each other on a dielectric material disposed on the substrate, an organosilicon compound disposed on the dielectric material directly beneath the first high density conductive structure, and disposed directly beneath the second high density conductive structure, and a second region of the substrate comprising a first low density conductive structure and a second low density conductive structure, wherein the first and second low density conductive structures do not comprise the organosilicon compound beneath the first and second low density conductive structures.

Example 2 includes the microelectronic package structure of example 1 wherein a pitch between the first and second high density conductive structures is less than about 100 microns.

Example 3 includes the microelectronic package structure of example 1 wherein a pitch between the first and second low density conductive structures is above about 200 microns.

Example 4 includes the microelectronic package structure of example 1 wherein the first and second high density conductive structures in the first and second regions comprise solder bumps.

Example 5 includes the microelectronic package structure of example 1 wherein the first region of the substrate comprises a conductive trace disposed on the dielectric material, wherein the conductive trace comprises a line width of less than about 12 microns.

Example 6 includes the microelectronic package structure of example 5 wherein the conductive trace comprises an organosilicon compound directly beneath the conductive trace.

Example 7 includes the microelectronic package structure of example 1 wherein the organosilicon molecule comprises one of a siloxane or a silanol compound.

Example 8 includes the microelectronic package structure of example 1 wherein the substrate comprises one of a PCB board or an HDI board.

Example 9 is microelectronic package structure comprising a high density region on a board comprising a first plurality of conductive structures disposed on a dielectric material disposed on the board, wherein the first plurality of conductive structures comprises a first pitch between individual ones of the first plurality of conductive structures, and a low density region on the board comprising a second plurality of conductive structures disposed on the dielectric material, wherein the second plurality of conductive structures comprises a second pitch between individual ones of the second plurality of conductive structures, wherein the second pitch is more than about twice the magnitude of the first pitch.

Example 10 includes the microelectronic package structure of claim 9 wherein an organosilicon compound is disposed directly beneath individual ones of the first plurality of conductive structures.

Example 11 includes the microelectronic package structure of example 9 wherein the high density region further comprises at least one conductive trace, wherein a line width and a line space of the at least one conductive trace comprises less than about 12 microns.

Example 12 includes the microelectronic package structure of example 9 wherein the first plurality of conductive structures comprise a plurality of plated conductive metal structures disposed on an organosilicon compound.

Example 13 includes the microelectronic package structure of example 9 wherein the board comprises one of a PCB or a HDI board.

Example 14 includes the microelectronic package structure of example 9 wherein the high density region and the low density region are adjacent each other.

Example 15 includes the microelectronic package structure of example 12 wherein the organosilicon compound is not disposed on the dielectric material in the low density region.

Example 16 includes the microelectronic package structure of example 12, wherein a die is coupled with the microelectronic package structure.

Example 17 is a method of forming a microelectronic package structure, comprising forming an activated region in a dielectric material disposed on a board wherein the activated region is created by laser patterning, forming an organosilicon compound on the activated region, and forming a conductive material on the organosilicon compound in the high density region, wherein the board further comprises a low density region adjacent the high density region, wherein the dielectric material is not laser patterned in the low density region.

Example 18 includes the method of example 17 wherein the laser patterning comprises forming vias in the activated area with a laser.

Example 19 includes the method of example 17 wherein forming the conductive material comprises forming the conductive material using an electroless plating process comprising a palladium catalyst.

Example 20 includes the method of example 17 wherein forming the conductive material comprises forming at least one of nickel or copper.

Example 21 includes the method of example 17 wherein forming the conductive material comprises forming a first conductive pad on the organosilicon compound and forming a second conductive pad on the organosilicon compound that is adjacent to the first conductive pad, wherein a pitch between the first conductive pad and the second conductive pad is less than about 12 microns.

Example 22 includes the method of example 17 further comprising wherein a surface finish comprising at least one of nickel or gold is formed on the conductive material.

Example 23 includes the method of example 17 further comprising wherein the low density region comprises a plurality of conductive pads, wherein the plurality of conductive pads is not disposed on an organosilicon compound, and wherein a pitch between adjacent individual ones of the conductive pads is greater than about 200 microns.

Example 24 includes the method of claim 17 wherein the high density region comprises at least one conductive trace formed on an organosilicon compound disposed in an activated region, wherein the conductive trace comprises a line width and a line space between adjacent conductive traces of the at least one conductive trace that comprises less than about 12 microns.

Example 25 includes the method of claim 17 wherein the wherein the board comprises one of a PCB or a HDI board.

Example 26 includes the microelectronic package structure of example 1 wherein the first region comprises a pitch between solder bumps of between about 70 microns and about 110 microns, a line spacing of between about 9 microns and about 12 microns, and a line width of between about 9 microns and about 12 microns.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
a first region of a substrate comprising a first high density conductive structure and a second high density conductive structure, wherein the first and second high density conductive structures are adjacent each other on a dielectric material disposed on the substrate;
an organosilicon compound disposed on the dielectric material directly beneath the first high density conductive structure, and disposed directly beneath the second high density conductive structure; and
a second region of the substrate comprising a first low density conductive structure and a second low density conductive structure, wherein the first and second low density conductive structures do not comprise the organosilicon compound beneath the first and second low density conductive structures.

2. The microelectronic package structure of claim 1 wherein a pitch between the first and second high density conductive structures is between about 70 microns and about 110 microns.

3. The microelectronic package structure of claim 1 wherein a pitch between the first and second low density conductive structures is between about 200 microns and about 600 microns.

4. The microelectronic package structure of claim 1 wherein the first and second high density conductive structures in the first and second regions comprise solder bumps.

5. The microelectronic package structure of claim 1 wherein the first region of the substrate comprises a conductive trace disposed on the dielectric material, wherein the conductive trace comprises a line width of less than about 12 microns.

6. The microelectronic package structure of claim 5 wherein the conductive trace comprises an organosilicon compound directly beneath the conductive trace.

7. The microelectronic package structure of claim 1 wherein the organosilicon molecule comprises one of a siloxane or a silanol compound.

8. The microelectronic package structure of claim 1 wherein the substrate comprises one of a PCB board or an HDI board.

9. A microelectronic package structure comprising:
- a high density region on a board comprising a first plurality of conductive structures disposed on a dielectric material disposed on the board, wherein the first plurality of conductive structures comprises a first pitch between individual ones of the first plurality of conductive structures, and wherein an organosilicon compound is disposed directly beneath individual ones of the first plurality of conductive structures; and
- a low density region on the board comprising a second plurality of conductive structures disposed on the dielectric material, wherein the second plurality of conductive structures comprises a second pitch between individual ones of the second plurality of conductive structures, wherein the second pitch is more than about twice the magnitude of the first pitch.

10. The microelectronic package structure of claim 9 wherein the high density region further comprises at least one conductive trace, wherein a line width and a line space of the at least one conductive trace comprises less than about 12 microns.

11. The microelectronic package structure of claim 9 wherein the first plurality of conductive structures comprise a plurality of plated conductive metal structures disposed on an organosilicon compound.

12. The microelectronic package structure of claim 11 wherein the organosilicon compound is not disposed on the dielectric material in the low density region.

13. The microelectronic package structure of claim 11, wherein a die is coupled with the microelectronic package structure.

14. The microelectronic package structure of claim 9 wherein the board comprises one of a PCB or a HDI board.

15. The microelectronic package structure of claim 9 wherein the high density region and the low density region are adjacent each other.

16. A method of forming a microelectronic package structure, comprising:
- forming an activated region in a dielectric material disposed on a board wherein the activated region is created by laser patterning;
- forming an organosilicon compound on the activated region; and
- forming a conductive material on the organosilicon compound, wherein the activated region comprises a high density region, and wherein the board further comprises a low density region adjacent the high density region, wherein the dielectric material is not laser patterned in the low density region, and wherein the low density region is free of the organosilicon compound.

17. The method of claim 16 wherein the laser patterning comprises forming vias in the activated area with a laser.

18. The method of claim 16 wherein forming the conductive material comprises forming the conductive material using an electroless plating process comprising a palladium catalyst.

19. The method of claim 16 wherein forming the conductive material comprises forming at least one of nickel, copper, silver or gold.

20. The method of claim 16 wherein forming the conductive material comprises forming a first conductive pad on the organosilicon compound and forming a second conductive pad on the organosilicon compound that is adjacent to the first conductive pad, wherein a pitch between the first conductive pad and the second conductive pad is less than about 12 microns.

21. The method of claim 16 further comprising wherein a surface finish comprising at least one of nickel or gold is formed on the conductive material.

22. The method of claim 16 further comprising wherein the low density region comprises a plurality of conductive pads, wherein the plurality of conductive pads is not disposed on an organosilicon compound, and wherein a pitch between adjacent individual ones of the conductive pads is greater than about 200 microns.

23. The method of claim 16 wherein the high density region comprises at least one conductive trace formed on the organosilicon compound disposed on the activated region, wherein the conductive trace comprises a line width and a line space between adjacent conductive traces of the at least one conductive trace, wherein at least one of the line width and the line space comprises less than about 12 microns.

24. The method of claim 16 wherein the wherein the board comprises one of a PCB or a HDI board.

\* \* \* \* \*